US012648135B2

(12) United States Patent　　　　(10) Patent No.:　US 12,648,135 B2
Yang et al.　　　　　　　　　　　　(45) Date of Patent:　Jun. 2, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventors: Na Yeong Yang, Gyeonggi-do (KR); Ki Jun Yun, Gyeonggi-do (KR); Jung Shik Jang, Gyeonggi-do (KR); In Su Park, Gyeonggi-do (KR); Seok Min Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 387 days.

(21) Appl. No.: 18/527,926

(22) Filed: Dec. 4, 2023

(65) Prior Publication Data

US 2025/0081454 A1　　Mar. 6, 2025

(30) Foreign Application Priority Data

Sep. 4, 2023　(KR) ........................ 10-2023-0117017

(51) Int. Cl.
　　*H10B 41/30*　　　(2023.01)
　　*H10B 41/23*　　　(2023.01)
(52) U.S. Cl.
　　CPC ............. *H10B 41/30* (2023.02); *H10B 41/23* (2023.02)
(58) Field of Classification Search
　　CPC ........ H10B 41/30; H10B 41/23; H10B 12/30; H10B 12/02; H10B 12/05; H10B 41/27; H10B 43/27; H10B 43/30; H10P 50/691
　　See application file for complete search history.

(56) References Cited

U.S. PATENT DOCUMENTS

| | | | | |
|---|---|---|---|---|
| 9,576,967 | B1 * | 2/2017 | Kimura | H10B 43/10 |
| 9,991,280 | B2 | 6/2018 | Nakamura et al. | |
| 10,346,088 | B2 * | 7/2019 | Righetti | G06F 3/0688 |
| 10,658,377 | B2 * | 5/2020 | Kubo | H10B 43/27 |
| 10,854,627 | B1 * | 12/2020 | Moriyama | H10B 43/27 |
| 10,971,507 | B2 * | 4/2021 | Kaminaga | H10B 41/30 |
| 11,393,672 | B2 * | 7/2022 | Hopkins | H10B 43/35 |
| 2011/0312174 | A1 * | 12/2011 | Lee | H10B 43/20 |
| | | | | 257/E21.294 |
| 2017/0345843 | A1 * | 11/2017 | Lee | H10B 43/27 |
| 2018/0331117 | A1 * | 11/2018 | Titus | H10B 43/27 |
| 2018/0366487 | A1 * | 12/2018 | Okizumi | H10B 43/20 |
| 2019/0102104 | A1 * | 4/2019 | Righetti | G06F 3/0688 |
| 2019/0304992 | A1 * | 10/2019 | Baek | H10B 43/27 |
| 2020/0119038 | A1 * | 4/2020 | Hopkins | H10B 43/27 |
| 2021/0066347 | A1 * | 3/2021 | Titus | H10B 43/50 |
| 2021/0249261 | A1 * | 8/2021 | Hopkins | H10B 43/35 |
| 2022/0020760 | A1 * | 1/2022 | Wang | H10B 41/27 |
| 2022/0139944 | A1 * | 5/2022 | Hwang | H10B 41/27 |
| | | | | 257/314 |
| 2022/0149072 | A1 * | 5/2022 | Gu | H10B 43/27 |

(Continued)

*Primary Examiner* — Victor A Mandala
(74) *Attorney, Agent, or Firm* — IP & T GROUP LLP

(57)　　　　ABSTRACT

A semiconductor device may include: a first gate structure; a second gate structure disposed over the first gate structure; and a channel structure including a first portion extending through the first gate structure, the first portion having a tapered cross section, a second portion having a tapered cross section, and a third portion connecting the first portion with the second portion, wherein the third portion has a vertical profile, and wherein the second portion and the third portion extends through the second gate structure.

5 Claims, 6 Drawing Sheets

(56) References Cited

U.S. PATENT DOCUMENTS

| | | | |
|---|---|---|---|
| 2022/0223524 A1* | 7/2022 | Choi | H10B 41/10 |
| 2023/0354603 A1* | 11/2023 | Choi | H10B 43/35 |
| 2023/0413569 A1* | 12/2023 | Lee | C30B 29/68 |
| 2024/0292627 A1* | 8/2024 | Murooka | H10B 41/35 |
| 2026/0006784 A1* | 1/2026 | Billingsley | H10B 41/27 |

* cited by examiner

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2023-0117017 filed on Sep. 4, 2023, which is incorporated herein by reference in its entirety.

BACKGROUND

1. Technical Field

Various embodiments of the present disclosure relate to an electronic device and a manufacturing method of the electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment of the present disclosure, a semiconductor device may include: a first gate structure; a second gate structure disposed over the first gate structure; and a channel structure including a first portion extending through the first gate structure, the first portion having a tapered cross section, a second portion having a tapered cross section, and a third portion connecting the first portion with the second portion, wherein the third portion has a vertical profile, and wherein the second portion and the third portion extends through the second gate structure.

In an embodiment of the present disclosure, a manufacturing method of a semiconductor device may include: forming a first stack; forming a first opening extending through the first stack and having a cross section with a tapered shape; forming a second stack on the first stack; forming a second opening extending through the second stack and including a first region having a cross section with a tapered shape and a second region connecting the first region and the first opening to each other and having a vertical profile; and forming a channel structure in the first opening and the second opening.

In an embodiment of the present disclosure, a manufacturing method of a semiconductor device may include: forming a stack; forming a mask pattern on the stack, the mask pattern including carbon; forming an opening having a cross section with a tapered shape by etching the stack using the mask pattern as an etching barrier; forming a protective layer by adsorbing an etching byproduct of the mask pattern to an inner wall of the opening; and extending the opening in a vertical profile by etching the stack exposed by the protective layer.

These and other features and advantages of the present invention may become better understood from the following drawings and detailed description.

DETAILED DESCRIPTION

Various embodiments of the present disclosure are directed to a semiconductor device and a manufacturing method of the semiconductor device. The semiconductor device has a stable structure and improved characteristics.

Hence, according to embodiments of the present disclosure, it is possible to provide a semiconductor device having a stable structure and improved reliability.

Hereafter, embodiments in accordance with the technical concepts of the present disclosure are described with reference to the accompanying drawings.

Figure 1:
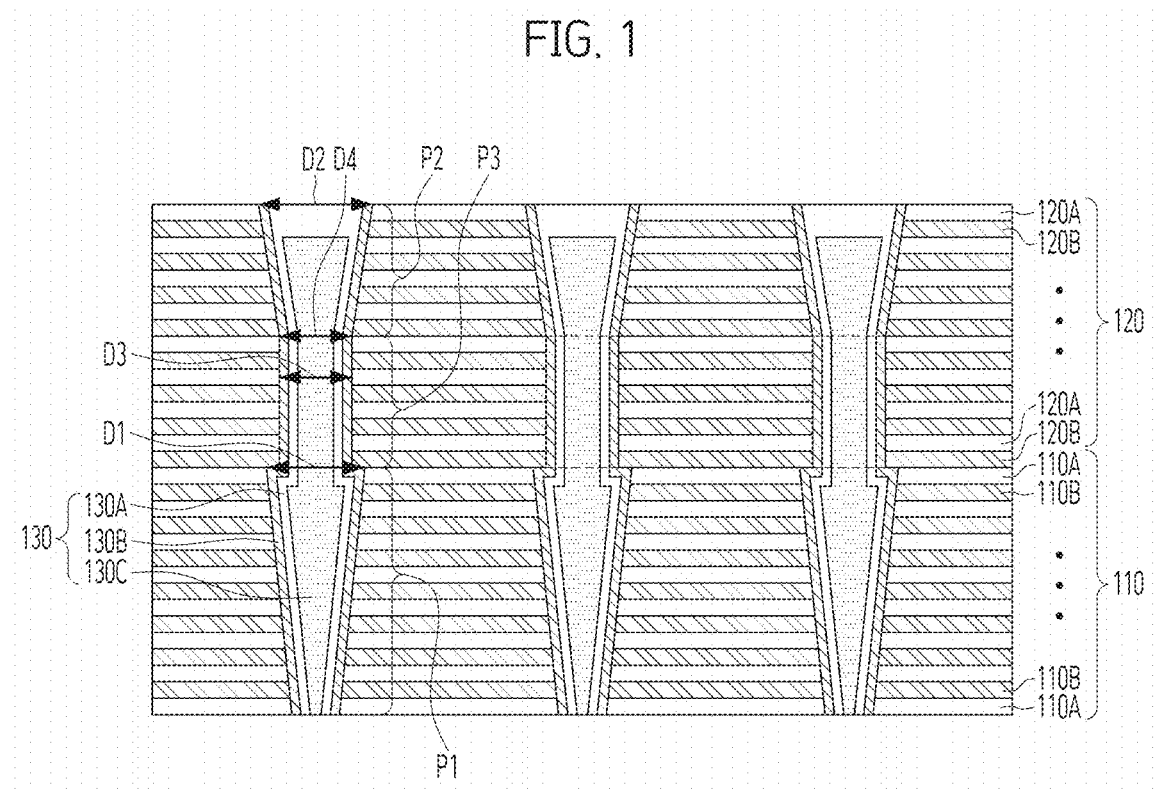
FIG. 1 is a simplified diagram illustrating a semiconductor device in accordance with an embodiment of the present disclosure.

FIG. 1 is a simplified diagram illustrating a semiconductor device in accordance with an embodiment of the present disclosure.

Referring now to FIG. 1, the semiconductor device may include at least one of a first gate structure 110, a second gate structure 120 disposed over the first gate structure 110 and channel structures 130.

The first gate structure 110 may include first insulating layers 110A and first conductive layers 110B that are alternately stacked over each other in a first direction. The first direction may for example be a vertical direction. The first insulating and first conductive layers 110A and 110B may extend parallel to second and third directions. The second and third directions may form a plane, e.g., a horizontal plane. For example, the first conductive layers 110B may be used as word lines, bit lines, or select lines. The first insulating layers 110A may be made of any suitable insulating material including, for example, an insulating material such as an oxide (e.g., silicon oxide), and the first conductive layers 110B may each include a conductive material such as metal, e.g., tungsten or molybdenum, and or a polysilicon conductive material.

The second gate structure 120 may be disposed on the first gate structure 110. The second gate structure 120 may overlap with the first gate structure 110 in the first direction. The second gate structure may include second insulating layers 120A and second conductive layers 120B that are alternately stacked. For example, the second conductive layers 120B may be used as word lines, bit lines, or select lines. The second insulating layers 120A may be made of any suitable insulating material including, for example, an insulating material such as an oxide (e.g., silicon oxide), and the second conductive layers 120B may each include a conductive material such as metal, e.g., tungsten or molybdenum, or a polysilicon conductive material.

The channel structures 130 may penetrate into the first gate structure 110 through the second gate structure 120. The channel structures 130 may be spaced apart from each other forming a regular pattern and may extend through the first and second gate structures. Each of the channel structures 130 may include a channel layer 130A. Each of the channel structures 130 may further include at least one of a memory layer 130B surrounding the channel layer 130A and an insulating core 130C in the channel layer 130A. The channel structure 130 may include first, second and third portions or sections P1, P2, and P3 characterized by their relative positioning within the gate structures 110 and 120 and their geometrical features. The first portion P1 may extend through the first gate structure 110, the second portion P2 may extend through the second gate structure 120, and the third portion P3 may be disposed between the first portion P1 and the second portion P2. For example, the third portion P3 may extend through the second gate structure 120.

The channel structure 130 may have a cross section with a tapered shape. Forming each of the channel structures 130 includes first forming an opening. The energy provided for the etching process to form the opening is gradually reduced the deeper the opening becomes, i.e., the energy amount becomes relatively smaller from an upper portion of the opening toward a lower portion of the opening. Accordingly, an opening having a cross section with a tapered shape whose width becomes smaller from an upper portion, e.g., the top surface toward a lower portion, e.g., a bottom surface may be formed, and the channel structure 130 having a tapered cross section may be formed in the opening. For example, the first portion P1 of the channel structure 130 may have a cross section with a tapered shape, and the second portion P2 may have a cross section with a tapered shape.

However, the present disclosure is not limited thereto, and the channel structure 130 may have a cross section with another shape in addition to the cross section with the tapered shape. For example, in a variation of the illustrated embodiment, the channel structure 130 may have a vertical profile. For example, the channel structure 130 may have a vertical profile with substantially constant cross-section that does not change along the height of the channel structure 130. An etching byproduct may be formed in a process of forming the opening, and may be adsorbed to an upper portion of the opening to form a protective layer. Because the protective layer is not formed at a lower portion of the opening, a lower portion of the opening may be expanded even with relatively small energy to have a vertical profile. For example, the third portion P3 of the channel structure 130 may have a vertical profile.

The first portion P1 may have a first width D1, the second portion P2 may have a second width D2 and a fourth width D4, and the third portion P3 may have a third width D3. For example, the first width D1 refers to the width of the top surface of the first portion P1. The second width D2 refers to a width of the top surface of the second portion P2, and the fourth width D4 refers to a width of the bottom surface of the second portion P2.

The third width D3 may be smaller than the width of the top surface of the first portion P1. For example, the third width D3 may be smaller than the first width D1. The third width D3 may be smaller than the width of the top surface of the second portion P2. For example, the third width D3 may be smaller than the second width D2. The third width D3 may be substantially the same as the width of the bottom surface of the second portion P2. For example, the third width D3 may be substantially the same as the fourth width D4. A width of the top surface and a width of the bottom surface of the third portion P3 may be substantially the same. This is because the third portion P3 may have the vertical profile. Accordingly, the third width D3 of the third portion P3 may be uniform. Because the third portion P3 has an expanded vertical profile, connectivity between the first portion P1 and the second portion P2 may be improved compared to a case where the third portion P3 has a cross section with a tapered shape.

According to the structure described above, the third portion P3 connecting the first portion P1 and the second portion P2 of the channel structure 130 to each other has the vertical profile. Accordingly, the connectivity between the first portion P1 and the second portion P2 may be improved compared to the case where the third portion P3 has a cross section with a tapered shape.

Figure 2:
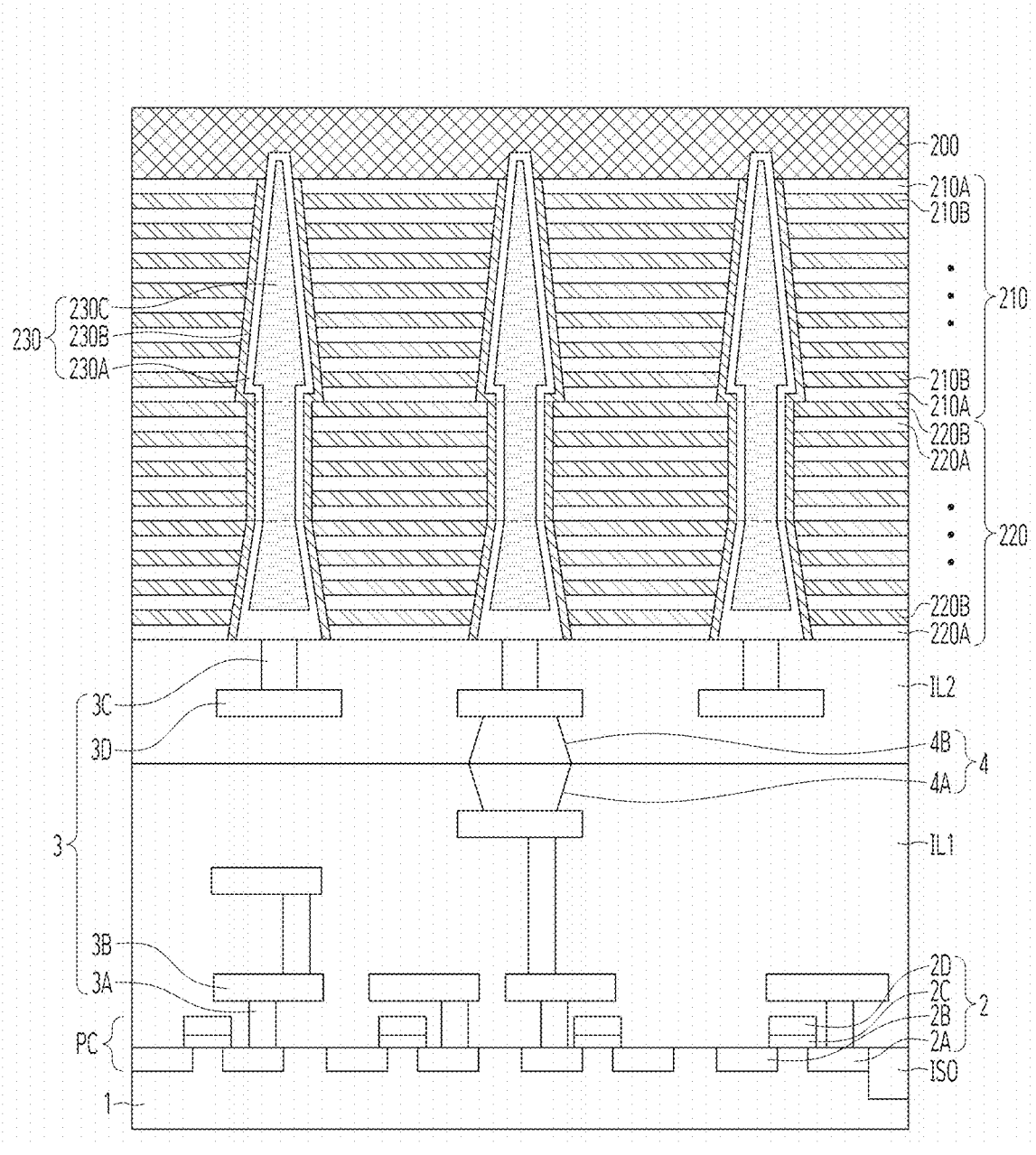
FIG. 2 is a simplified diagram illustrating a semiconductor device in accordance with an embodiment of the present disclosure.

FIG. 2 is a simplified diagram illustrating a semiconductor device in accordance with an embodiment of the present disclosure. Hereinafter, any content overlapping with previously described content may be omitted.

Referring to FIG. 2, the semiconductor device may include at least one of a substrate 1, a first gate structure 210, a second gate structure 220, channel structures 230, and a source structure 200. The semiconductor device may further include at least one of an isolation insulating layer ISO, a peripheral circuit PC, an interconnection structure 3, a bonding structure 4, a first interlayer insulating layer IL1, and a second interlayer insulating layer IL2.

The substrate 1 may be a semiconductor substrate such as a silicon wafer, a SiGe wafer, or a silicon on insulator (SOI) wafer. The peripheral circuit PC may be disposed on or over the substrate 1, and the isolation insulating layer ISO may be disposed in the substrate 1. An active region may be defined by the isolation insulating layer ISO. The peripheral circuit PC may include transistors 2, capacitors, resistors, and the like. For example, the transistor 2 may include a first junction 2A, a second junction 2B, a gate insulating layer 2C, or a gate electrode 2D. The gate insulating layer 2C may be disposed between the gate electrode 2D and the substrate 1. The gate insulating layer 2C and the isolation insulating layer ISO may each include an insulating material such as oxide or nitride.

The interconnection structure 3 may be disposed on the substrate 1. For example, the interconnection structure 3 may include first contact vias 3A, first wiring lines 3B, second contact vias 3C, and second wiring lines 3D. The first contact vias 3A and the first wiring lines 3B may be disposed in the first interlayer insulating layer IL1. For example, the first interlayer insulating layer IL1 may be disposed on the substrate 1. At least one of the first contact vias 3A may be connected to the transistor 2. The first wiring lines 3B may be connected to the first contact vias 3A, respectively.

The first gate structure 210 and the second gate structure 220 may be disposed on the peripheral circuit PC. The first gate structure 210 may include first insulating layers 210A and first conductive layers 210B that are alternately stacked, and the second gate structure 220 may include second insulating layers 220A and second conductive layers 220B that are alternately stacked. The insulating layers 210A and 220A may each include an insulating material such as oxide, and the conductive layers 210B and 220B may each include a conductive material such as tungsten, molybdenum, or polysilicon. The conductive layers 210B and 220B may be used as word lines, bit lines, or select lines.

The source structure 200 may be disposed on the first gate structure 210 and the second gate structure 220. The channel structures 230 may extend into source structure 200 through the first gate structure 210 and the second gate structure 220. The channel structures 230 may be connected to the source structure 200. The channel structures 230 may have a cross section with a tapered shape. In addition, the channel structures 230 may have a vertical profile. Each of the channel structures 230 may include at least one of a channel layer 230A, a memory layer 230B surrounding the channel layer 230A, and an insulating core 230C in the channel layer 230A. For example, the channel layer 230A may be connected to the source structure 200.

The second contact vias 3C and the second wiring lines 3D of the interconnection structure 3 may be disposed below the first gate structure 210 and the second gate structure 220. The second contact vias 3C may be connected to the channel structures 230, respectively. The second wiring lines 3D may be disposed below the second contact vias 3C, respectively. The second wiring lines 3D may be connected to the second contact vias 3C, respectively. The second contact vias 3C and the second wiring lines 3D may be disposed in the second interlayer insulating layer IL2.

The bonding structure 4 may be disposed between the second gate structure 220 and the peripheral circuit PC. The bonding structure 4 may include first bonding pads 4A disposed in the first interlayer insulating layer IL1, and second bonding pads 4B disposed in the second interlayer insulating layer IL2. The first bonding pads 4A may be connected to at least one of the first wiring lines 3B, and the second bonding pads 4B may be connected to at least one of the second wiring lines 3D. The first bonding pads 4A and the second bonding pads 4B may be bonded or coupled to each other. The first and second bonding pads 4A and 4B may be in direct contact to each other.

According to the structure described above, a wafer composed of a memory cell array including the channel structures 230 and the peripheral circuit PC related to an operation of the memory cell array may be configured as separate wafers and then be bonded or coupled to each other. Configuring the peripheral circuit PC related to the operation of the memory cell array as a separate wafer is advantageous because it allows more memory cells to be disposed on the wafer including the memory cell array, and thus, more data may be stored.

Figure 3:
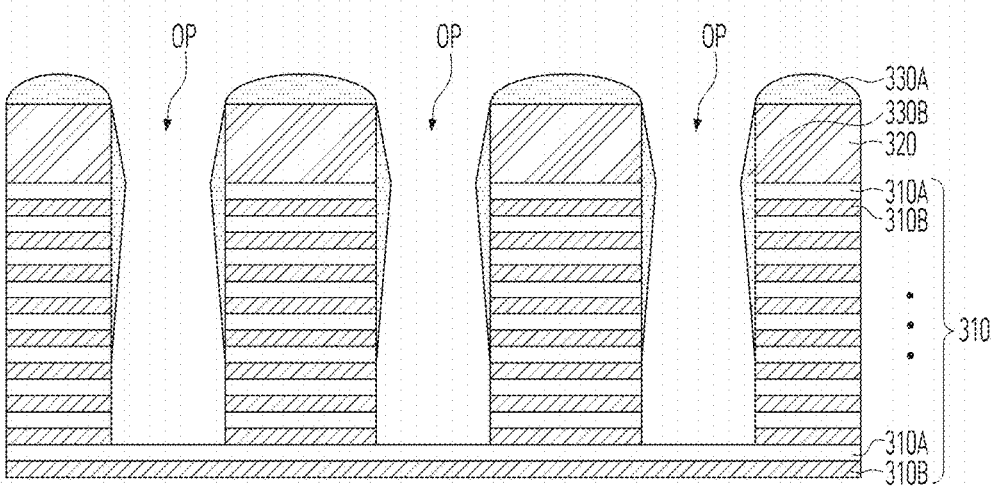
FIG. 3 is a simplified diagram illustrating a manufacturing method of a semiconductor device in accordance with an embodiment of the present disclosure.

FIG. 3 is a simplified diagram illustrating a manufacturing method of a semiconductor device in accordance with an embodiment of the present disclosure. Hereinafter, any content overlapping with previously described content may be omitted.

Referring to FIG. 3, a stack 310 (also referred to as a multilayer structure 310) including first material layers 310A and second material layers 310B may be formed.

Subsequently, a mask pattern 320 may be formed on the stack 310. For example, the mask pattern 320 may include carbon. The mask pattern 320 may include openings exposing locations where channel structures are to be formed.

Subsequently, openings OP may be formed by etching the stack 310 using the mask pattern 320 as an etching barrier. The openings OP may be formed by plasma treatment including fluorine (F). In a process of forming the openings OP, energy for etching may reach the openings OP in a relatively smaller amount from an upper (or top) portion of the opening OP toward the lower portion of the opening OP. In such a case, a width of a lower portion of the opening OP may be smaller than a width of an upper portion of the opening. Accordingly, the opening OP may be formed to have a cross section with a tapered shape.

When the mask pattern 320 including carbon is used as the etching barrier, etching byproducts 330A of the mask pattern 320 may be formed. For example, the etching byproduct 330A refers to carbon fluoride (CF) formed by a reaction between carbon (C) and fluorine (F). The etching byproducts 330A may be adsorbed to inner walls of the openings OP to form protective layers 330B. Because the openings OP are formed in a cryogenic environment, a sticking coefficient of the etching byproducts 330A may increase. When the sticking coefficient increases, the etching byproducts 330A may spread less. In such a case, more etching byproducts 330A may be adsorbed to upper portions of the openings OP than lower portions of the openings OP. The etching byproducts 330A may be adsorbed to the upper portions of the openings OP to form the protective layers 330B.

The protective layers 330B may not be formed at the lower portions of the openings OP or may be formed at a relatively small thickness at the lower portions of the openings OP. The lower portions of the openings OP may maintain a state in which the stack 310 to be etched is exposed, and the stack 310 may be etched even with relatively small energy at the lower portions of the openings OP, such that the lower portions of the openings OP may be expanded. Accordingly, the openings OP may be extended in a vertical profile by etching the stack 310 that is exposed by the protective layers 330B. For example, the stack 310 may be etched by ion plasma collision.

In addition, the openings OP may be formed by etching the stack 310 in a cryogenic environment of −15° C. or lower. For example, the openings OP may be formed in a cryogenic environment of −15° C. or lower, or −110° C. or higher and −15° C. or lower. This is because when the openings OP are formed in a cryogenic environment lower than −110° C., the etching byproducts 330A may be formed in excess at the upper portions of the openings OP and may block the openings OP, or the lower portions of the openings OP may be excessively expanded, such that bowing deterioration may occur, or the openings OP may have a cross section with a reversed tapered shape.

According to the method described above, the protective layers 330B are formed at the upper portions of the openings OP, and are not formed at the lower portions of the openings OP. Accordingly, the stack 310 to be etched may be etched even with a small etching energy at the lower portions of the openings OP, and the lower portions of the openings OP may extend to have a vertical profile. For example, the lower portions of the openings OP where protective layers 330B are not formed may extend at the lower ⅓ of the opening OP or lower ¼ of the opening OP, or the lower ⅕ of the opening OP.

FIGS. 4A to 4D are simplified diagrams illustrating a manufacturing method of a semiconductor device in accordance with an embodiment of the present disclosure. Hereinafter, any content overlapping with previously described content may be omitted.

Figure 4A:
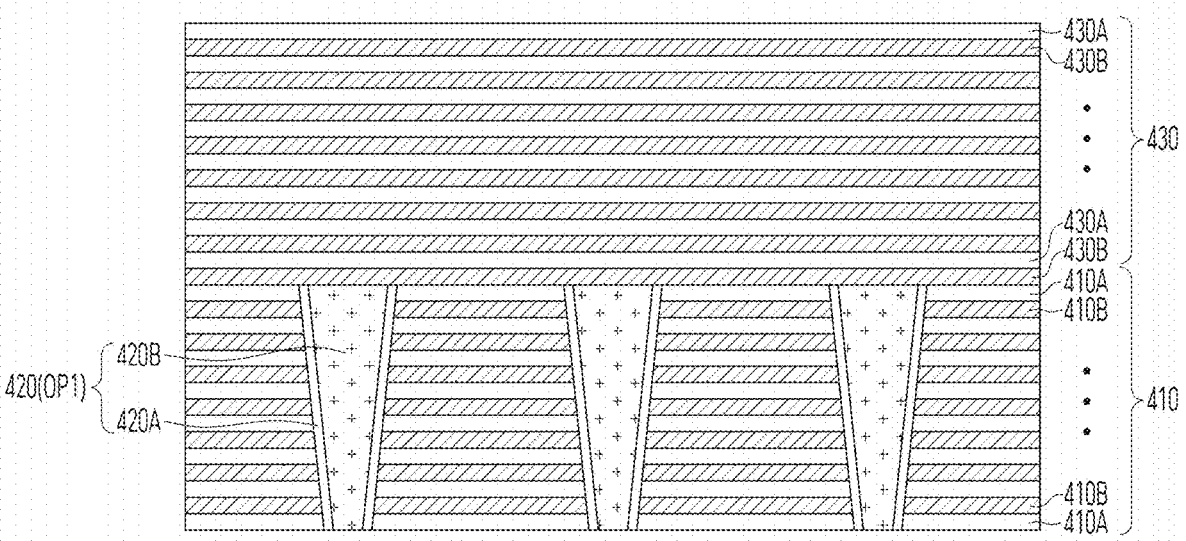
FIGS. 4A to 4D are simplified diagrams illustrating a manufacturing method of a semiconductor device in accordance with an embodiment of the present disclosure.

Referring to FIG. 4A, a first stack 410 may be formed. The first stack 410 may include first material layers 410A and second material layers 410B that are alternately stacked. For example, the first material layers 410A may each include an insulating material such as oxide. The second material layers 410B may each include a sacrificial material such as, for example, nitride. Alternatively, the second material layers 410B may each include a conductive material such as, for example, molybdenum or polysilicon.

Subsequently, first openings OP1 extending through the first stack 410 may be formed before the formation of the second stack 430. The first openings OP1 may have a cross section with a tapered shape. Subsequently, sacrificial layers 420 may be formed in the first openings OP1. First, first sacrificial layers 420A may be formed in the first openings OP1. Subsequently, second sacrificial layers 420B may be formed inside the first sacrificial layers 420A to fill the remaining space of the first openings OP1. For example, the first sacrificial layers 420A may include titanium nitride (TiN), and the second sacrificial layers 420B may include tungsten (W).

Subsequently, a second stack 430 may be formed on the first stack 410. The second stack 430 may include third material layers 430A and fourth material layers 430B that are alternately stacked. For example, the third material layers 430A may each include an insulating material such as oxide, and the fourth material layers 430B may each include a sacrificial material such as nitride. Alternatively, the fourth material layers 430B may each include a conductive material such as molybdenum or polysilicon.

Figure 4B:
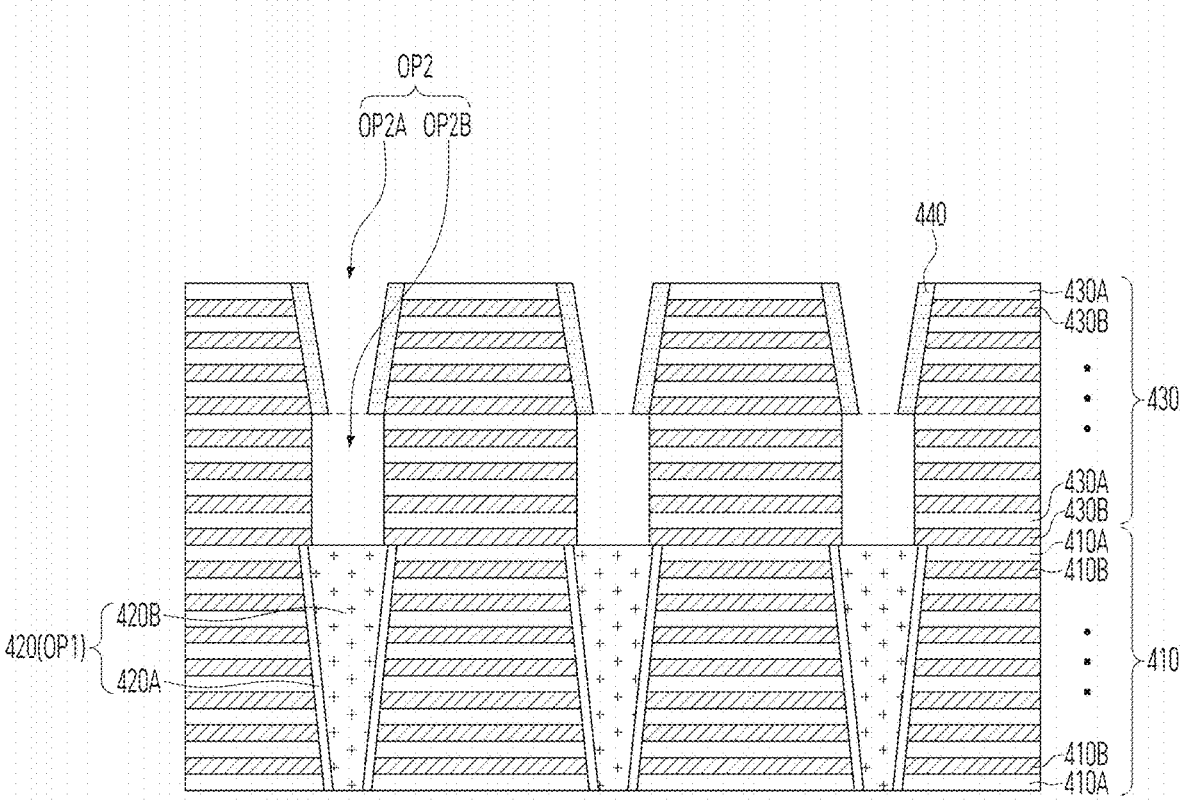

Referring to FIG. 4B, second openings OP2 extending through the second stack 430 may be formed. For example, the second openings OP2 extending through the second stack 430 and including first regions OP2A having a cross section with a tapered shape and second regions OP2B connecting the first regions OP2A and the first openings OP1 to each other and having a vertical profile may be formed. For example, the second openings OP2 may be formed by etching the second stack 430 in a cryogenic environment of −15° C. or lower, or at a temperature between −110° C. and −15° C.

First, a mask pattern (not illustrated) may be formed on the second stack 430. For example, the mask pattern may include carbon. Subsequently, the second stack 430 may be etched using the mask pattern as an etching barrier. In a process of forming the second openings OP2 by etching the second stack 430, energy for etching may decrease from the upper portion of the second opening OP2 toward the lower portion of the second opening OP2. In such a case, a width of a lower portion of the second opening OP2 may be smaller than a width of an upper portion of the second opening OP2. Accordingly, the first region OP2A of the second opening OP2 may have a cross section with a tapered shape.

In the process of forming the second openings OP2, etching byproducts of the mask pattern may be adsorbed to inner walls of the second openings OP2. For example, the etching byproducts may be formed in the first regions OP2A. For example, the etching byproducts adsorbed to the first regions OP2A may be used as protective layers 440. Because the second stack 430 may be etched even with a small etching energy in the second regions OP2B where the protective layers 440 are not formed, the second regions OP2B may be expanded to have a vertical profile. Accordingly, when the second openings OP2 are formed, the first regions OP2A may be protected by the protective layers 440, and the second regions OP2B may be expanded.

The sacrificial layers 420 may be exposed through second openings OP2. For example, the second sacrificial layers 420B may be exposed. For example, the sacrificial layers 420 may each include a material having a selectivity with respect to the third material layers 430A and the fourth material layers 430B of the second stack 430. For example, the second sacrificial layers 420B may each include tungsten having a selectivity with respect to the third material layers 430A and the fourth material layers 430B. Accordingly, the sacrificial layers 420 might not be removed in a process of expanding the second regions OP2B of the second openings OP2 by etching the second stack 430.

When the second sacrificial layer 420B includes tungsten, a byproduct may be formed by a reaction between plasma ions and tungsten. Because the formed byproduct has low photocatalytic efficiency, it is possible to prevent or minimize deformation of a profile of the second opening OP2 due to a chemical reaction on sidewalls of the second opening OP2.

Figure 4C:
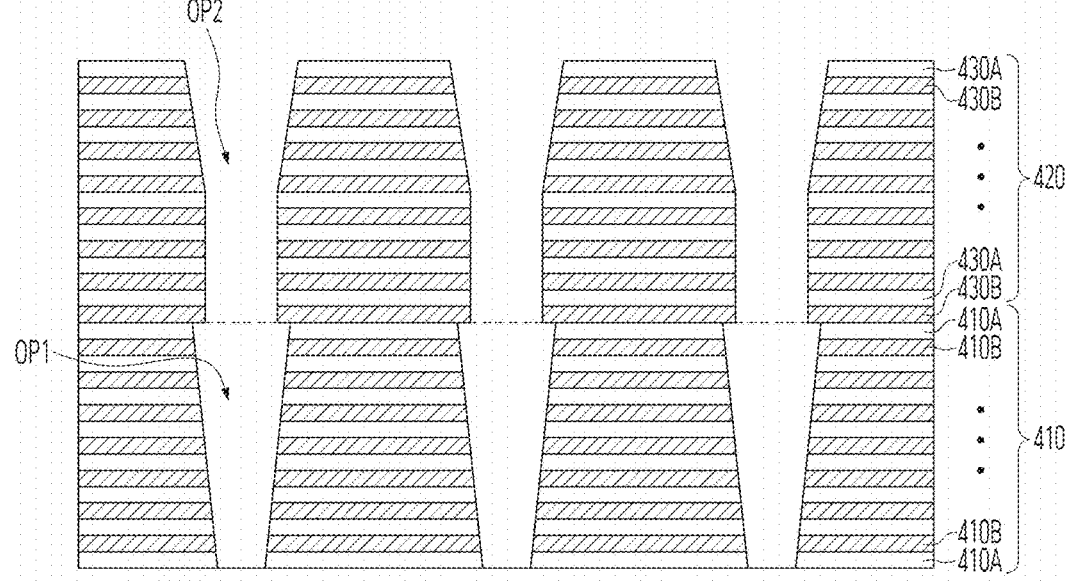

Referring to FIG. 4C, the first openings OP1 may be reopened by removing the sacrificial layers 420 exposed through the second openings OP2. Because the sacrificial layers 420 of the first openings OP1 are further exposed while the second regions OP2B are expanded, the sacrificial layers 420 may be more easily removed. Subsequently, the protective layers 440 may be removed. For example, a cleaning process may be performed, and the protective layers 440 may be removed in the cleaning process.

Figures 4D, 5A:
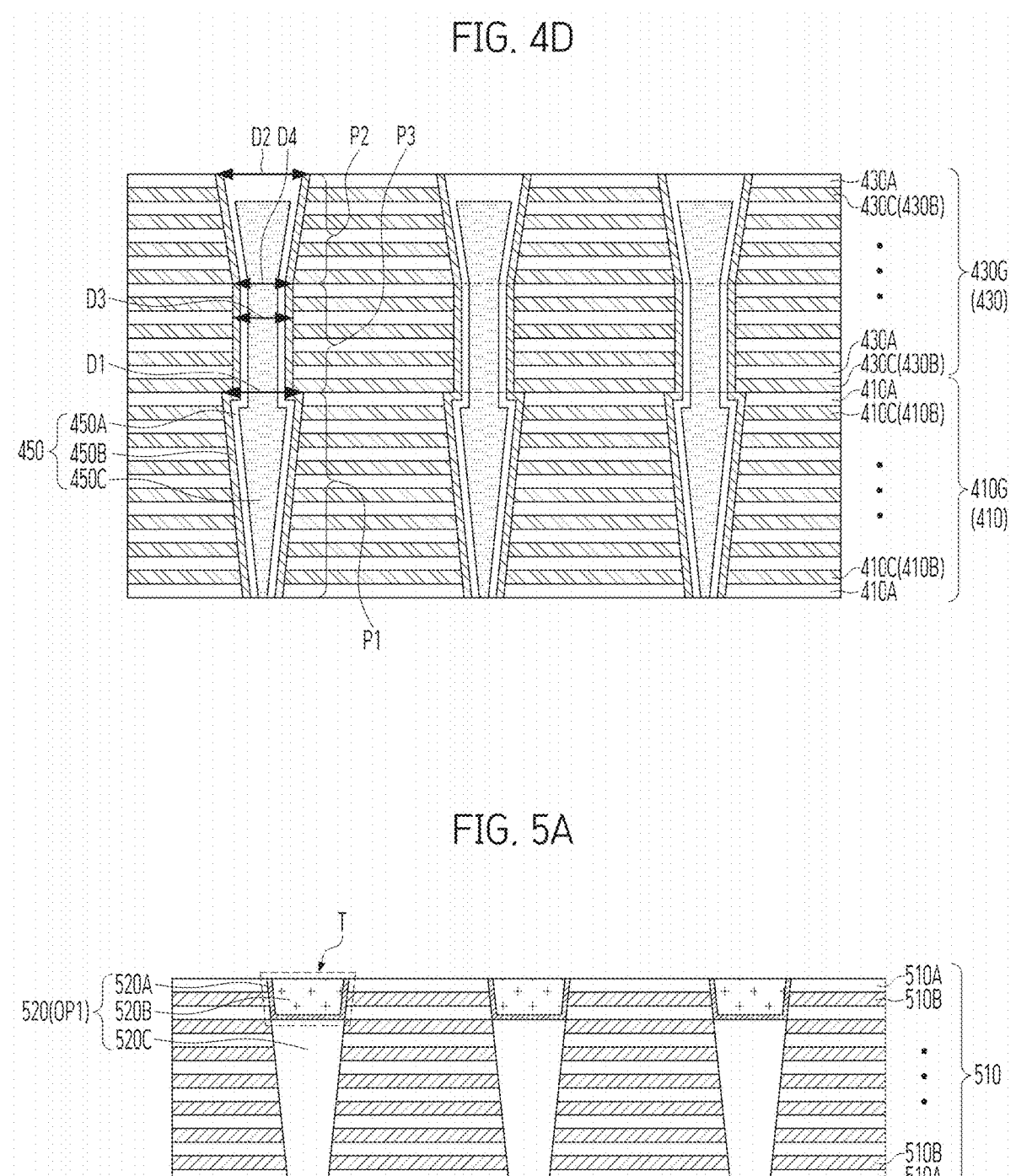
FIGS. 5A to 5C are simplified diagrams illustrating a manufacturing method of a semiconductor device in accordance with an embodiment of the present disclosure.

Referring to FIG. 4D, channel structures 450 may be formed in the first and the second openings OP1 and OP2. Each channel structure 450 may include a channel layer 450A and at least one of a memory layer 450B surrounding the channel layer 450A and an insulating core 450C in the channel layer 450A.

Each channel structure 450 may include a first portion P1 having a cross section with a tapered shape, a second portion P2 having a cross section with a tapered shape, and a third portion P3 disposed between the first portion P1 and the second portion P2 and having a vertical profile. The first portion P1 may have a first width D1, the second portion P2 may have a second width D2 and a fourth width D4, and the third portion P3 may have a third width D3. For example, the first width D1 refers to a width of a top surface of the first portion P1. The second width D2 refers to a width of a top surface of the second portion P2, and the fourth width D4 refers to a width of a bottom surface of the second portion P2. The third width D3 may be smaller than the first width D1. The third width D3 may be smaller than the second width D2. The third width D3 may be substantially the same as the fourth width D4. A width of a top surface and a width of the bottom surface of the third portion P3 may be substantially the same.

Subsequently, the second material layers 410B may be replaced with fifth material layers 410C through a slit (not illustrated). The fourth material layers 430B may be replaced with sixth material layers 430C through the slit. Consequently, first and second gate structures 410G and 420G may be formed. The first gate structure 410G may include the first material layers 410A and the fifth material layers 410C that are alternately stacked. The second gate structure 430G may include the third material layers 430A and the sixth material layers 430C that are alternately stacked. The fifth material layers 410C and the sixth material layers 430C may each include a conductive material such as tungsten, molybdenum, or polysilicon. For example, the fifth material layers 410C and the sixth material layers 430C may be word lines, bit lines, or select lines. For reference, when the second material layers 410B and the fourth material layers 430B each include a conductive material, replacement processes may be omitted. In such a case, the first stack 410 may be used as the first gate structure 410G, and the second stack 430 may be used as the second gate structure 430G. Subsequently, a slit structure (not illustrated) may be formed in the slit. For example, the slit structure may include an insulating material, a conductive material, a semiconductor material, or the like.

According to the manufacturing method described above, the protective layers 440 may not be formed in the second regions OP2B of the second openings OP2 in the process of forming the second openings OP2. Accordingly, even though relatively small etching energy reaches the second regions OP2B, the second regions OP2B may be expanded.

In addition, the second regions OP2B of the second openings OP2 may be expanded using the sacrificial layers 420 having the selectivity with respect to the third material layers 430A and the fourth material layers 430B of the second stack 430. Accordingly, as the second regions OP2B are expanded, the sacrificial layers 420 may be more easily removed.

Figure 5B:
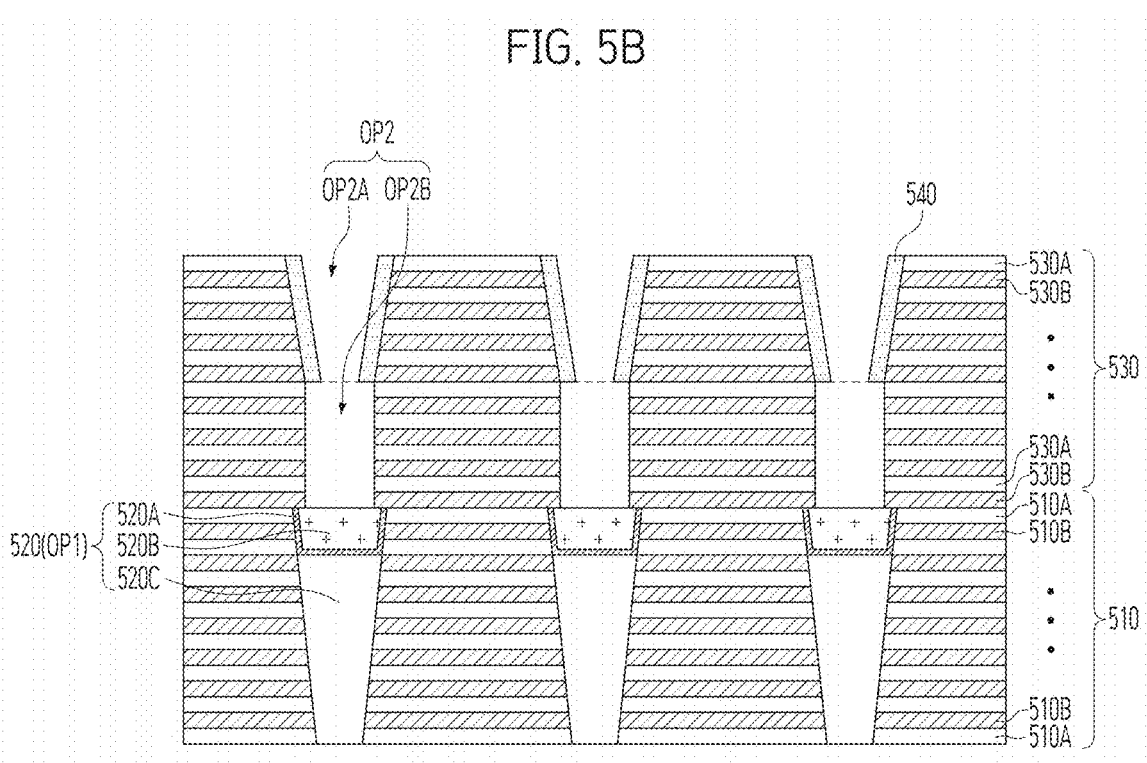
Figure 5C:
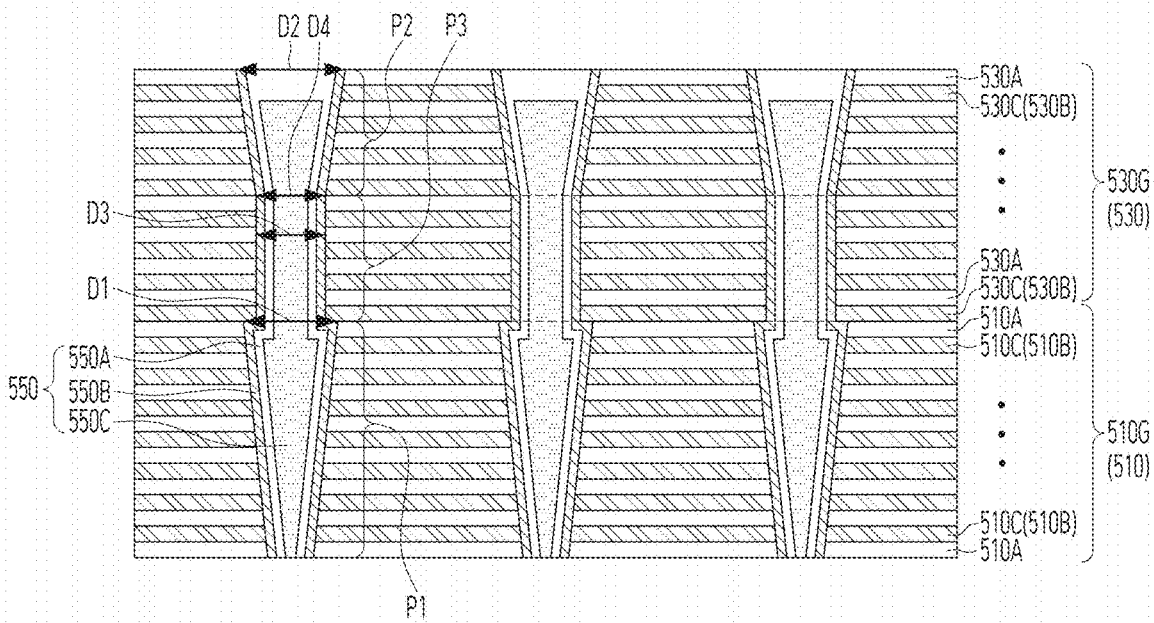

FIGS. 5A to 5C are simplified diagrams illustrating a manufacturing method of a semiconductor device in accordance with an embodiment of the present disclosure. Hereinafter, any content overlapping with previously described content may be omitted.

Referring to FIG. 5A, a first stack 510 including first material layers 510A and second material layers 510B that are alternately stacked may be formed. For example, the first material layers 510A may each include an insulating material such as oxide, and the second material layers 510B may each include a sacrificial material such as nitride. Alternatively, the second material layers 510B may each include a conductive material such as molybdenum or polysilicon.

Subsequently, sacrificial layers 520 may be formed in the first stack 510. First, first sacrificial layers 520C may be formed in first openings OP1. For example, the first sacrificial layers 520C may be formed to fill the first openings OP1. Subsequently, trenches T may be formed by partially etching the first sacrificial layers 520C. Subsequently, second sacrificial layers 520B may be formed in the trenches T. Before the second sacrificial layers 520B are formed, third sacrificial layers 520A may be formed in the trenches T. For example, the first sacrificial layer 520C may include carbon, the second sacrificial layer 520B may include tungsten, and the third sacrificial layer 520A may include titanium nitride (TiN).

Referring to FIG. 5B, a second stack 530 may be formed on the first stack 510. The second stack 530 may include third material layers 530A and fourth material layers 530B that are alternately stacked. For example, the third material layers 530A may each include an insulating material such as oxide, and the fourth material layers 530B may each include a sacrificial material such as nitride. Alternatively, the fourth material layers 530B may each include a conductive material such as molybdenum or polysilicon.

Subsequently, second openings OP2 extending through the second stack 530 and including first regions OP2A having a cross section with a tapered shape and second regions OP2B connecting the first regions OP2A and the first openings OP1 to each other and having a vertical profile may be formed. For example, the second openings OP2 may be formed by etching the second stack 530 in a cryogenic environment of −15° C. or lower, or at a temperature between −110° C. and −15° C.

First, a mask pattern (not illustrated) including carbon may be formed on the second stack 530. Subsequently, the second stack 530 may be etched using the mask pattern as an etching barrier. The first region OP2A of the second opening OP2 may have a cross section with a tapered shape. In a process of forming the second openings OP2, etching byproducts of the mask pattern may be adsorbed to inner walls of the first regions OP2A, and the etching byproducts adsorbed to the first regions OP2A may be used as protective layers 540. Because the second stack 530 may be etched even with a small etching energy in the second regions OP2B where the protective layers 540 are not formed, the second regions OP2B may be expanded to have a vertical profile. Accordingly, when the second openings OP2 are formed, the first regions OP2A may be protected by the protective layers 540, and the second regions OP2B may be expanded.

The second sacrificial layers 520B may be exposed through the second openings OP2. For example, the second sacrificial layers 520B may each include a material having a selectivity with respect to the third material layers 530A and the fourth material layers 530B of the second stack 530. For example, the second sacrificial layers 520B may each include tungsten. Accordingly, the second sacrificial layers 520B may not be removed in a process of expanding the second regions OP2B of the second openings OP2 by etching the second stack 530.

Referring to FIG. 5C, the first openings OP1 may be reopened by removing the sacrificial layers 520 exposed through the second openings OP2. Subsequently, the protective layers 540 may be removed, for example, by performing a cleaning process.

Subsequently, channel structures 550 may be formed in the first and the second openings OP1 and OP2. Each channel structure 550 may include a channel layer 550A. The channel structure 550 may further include at least one of a memory layer 550B surrounding the channel layer 550A and an insulating core 550C in the channel layer 550A.

The channel structure 550 may include a first portion P1 having a cross section with a tapered shape, a second portion P2 having a cross section with a tapered shape, and a third portion P3 disposed between the first portion P1 and the second portion P2 and having a vertical profile. The first portion P1 may have a first width D1, the second portion P2 may have a second width D2 and a fourth width D4, and the third portion P3 may have a third width D3. For example, the first width D1 refers to a width of a top surface of the first portion P1. The second width D2 refers to a width of a top surface of the second portion P2, and the fourth width D4 refers to a width of a bottom surface of the second portion P2. The third width D3 may be smaller than the first width D1. The third width D3 may be smaller than the second width D2. The third width D3 may be substantially the same as the fourth width D4. A width of a top surface and a width of the bottom surface of the third portion P3 may be substantially the same.

Subsequently, the second material layers 510B may be replaced with fifth material layers 510C through a slit (not illustrated). The fourth material layers 530B may be replaced with sixth material layers 530C through the slit. Consequently, a first gate structure 510G including the first material layers 510A and the fifth material layers 510C that are alternately stacked may be formed, and a second gate structure 530G including the third material layers 530A and the sixth material layers 530C that are alternately stacked may be formed. The fifth material layers 510C and the sixth material layers 530C may each include a conductive material such as tungsten, molybdenum, or polysilicon. For example, the fifth material layers 510C and the sixth material layers 530C may be word lines, bit lines, or select lines. Subsequently, a slit structure (not illustrated) may be formed in the slit. For example, the slit structure may include an insulating material, a conductive material, a semiconductor material, or the like.

According to the manufacturing method described above, the first sacrificial layers 520C including carbon may be formed in the first openings OP1. Subsequently, the trenches T may be formed by partially etching the first sacrificial layers 520C, and the second sacrificial layers 520B including tungsten may then be formed in the trenches T.

In addition, the protective layers 540 may not be formed in the second regions OP2B of the second openings OP2 in the process of forming the second openings OP2. Accordingly, even though a relatively small etching energy may reach the second regions OP2B, the second regions OP2B may be expanded.

The second regions OP2B of the second openings OP2 may be expanded using the second sacrificial layers 520B having the selectivity with respect to the third material layers 530A and the fourth material layers 530B of the second stack 530. Accordingly, as the second regions OP2B are expanded, the sacrificial layers 520 may be more easily removed.

Although embodiments according to the technical idea of the present disclosure have been described above with reference to the accompanying drawings, this is only for describing example embodiments according to the concepts of the present disclosure, and the present invention is not limited to the above embodiments. Various types of substitutions, modifications, and changes for the embodiments may be made by those skilled in the art, to which the present disclosure pertains, without departing from the invention as defined in the following claims, and it should be construed that these substitutions, modifications, and changes belong to the scope of the present disclosure. Furthermore, the embodiments may be combined to form additional embodiments.

What is claimed is:

1. A semiconductor device comprising:

a first gate structure;

a second gate structure disposed over the first gate structure; and a channel structure including a first portion extending through the first gate structure, the first portion having a tapered cross section, a second portion having a tapered cross section, and a third portion connecting the first portion with the second portion, wherein the third portion has a vertical profile, and wherein the second portion and the third portion extends through the second gate structure.

2. The semiconductor device of claim 1, wherein the second portion extends from a top surface of the second gate structure to the third portion which extends from an intermediate level the second gate structure to a bottom surface of the gate structure where it connects with a top surface of the first portion of the channel structure.

3. The semiconductor device of claim 1, wherein the first portion has a first width, the second portion has a second width, and the third portion has a third width smaller than the first width or the second width.

4. The semiconductor device of claim 3, wherein the third width is smaller than a width of a top surface of the first portion.

5. The semiconductor device of claim 3, wherein the third width is substantially the same as a width of a bottom surface of the second portion.

\* \* \* \* \*